United States Patent [19]
Tomishima

[11] Patent Number: 6,125,070
[45] Date of Patent: *Sep. 26, 2000

[54] SEMICONDUCTOR MEMORY DEVICE HAVING MULTIPLE GLOBAL I/O LINE PAIRS

[75] Inventor: Shigeki Tomishima, Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/283,246

[22] Filed: Apr. 1, 1999

[30] Foreign Application Priority Data

Nov. 9, 1998 [JP] Japan .................................. 10-318148

[51] Int. Cl.$^7$ ........................................................ G11C 8/00
[52] U.S. Cl. ......................... 365/230.03; 365/51; 365/63; 365/207
[58] Field of Search ........................ 365/230.03, 230.06, 365/207, 208, 51, 63

[56] References Cited

U.S. PATENT DOCUMENTS 5,781,495  7/1998  Arimoto ............................. 365/230.03
5,867,439  2/1999  Asakura ............................. 365/230.03
5,953,257  9/1999  Inoue et al. ....................... 365/230.03
5,966,340  10/1999 Fujino et al. ...................... 365/230.03

OTHER PUBLICATIONS

"a 286mm2 256Mb DRAM with X32 Both–Engs DQ", by Watanabe et al., 1995 Symposium on VLSI Circuits Digest of Technical Papers, pp. 105–106.

Primary Examiner—Trong Phan
Attorney, Agent, or Firm—McDermott, Will & Emery

[57] ABSTRACT

In a DRAM, many global I/O line pairs extend on memory cell arrays between sub-word driver regions or word line shunt regions. Local I/O line pairs are arranged on sense amplifier regions divided correspondingly to memory sub-blocks, respectively. Switching elements connecting the global I/O line pairs and local I/O line pairs are dispersed on the sense amplifier regions. A plurality of bit lines are commonly connected to each local I/O line pair. Therefore, the DRAM allows input/output of data of multiple bits while suppressing decrease in operation speed and increase in power consumption.

12 Claims, 14 Drawing Sheets

SEMICONDUCTOR MEMORY DEVICE HAVING MULTIPLE GLOBAL I/O LINE PAIRS

BACKGROUND OF THE INVENTION

1. Field of the Invention

The present invention relates to a semiconductor memory device, and particularly a semiconductor memory device having multiple global I/O line pairs.

2. Description of the Background Art

In semiconductor memory devices such as dynamic random access memories (DRAMs), simultaneous input/output of data of multiple bits has been required because of increase in number of banks as well as increase in transfer rate and capacity. However, conventional memory cell array structures cannot satisfy these requirements without difficulty.

A first cause of the above is increase in number of banks. Generally, DRAMs have employed bank structures for hiding disadvantages caused by low access. For example, an SDRAM employs 4 banks, an RDRAM employs 16 banks, and SLDRAM employs 8 banks. These DRAMs operate as if a plurality of independent memories are present in one chip. Although there is a tendency to increase the number of banks, this results in decrease in number of physical memory cells allocated to each bank so that it is difficult to ensure a wide bit width.

A second cause is that the number of data to be prefetched has been increased for achieving a high transfer rate. The above three kinds of DRAMs have already employed a so-called double data rate (DDR) technique in which input/output of data is performed using both rising and falling edges of a clock for increasing the data transfer rate. At present, it is impossible to achieve revolutionary increase in read/write speed. In view of this as well as the fact that an array operation speed may be reduced due to lowering of operation voltage, reduction in size of components, and increase in capacity and therefore array mat size, a prefetch method has become the mainstream rather than the DDR technique. In the prefetch method, data is fully fetched at a time from an array to a latch circuit or a register, and thereafter will be output gradually or little by little. For ensuring the quantity of data which can be prefetched, it is necessary to ensure a sufficient bit width with respect to the array mat.

A third cause is restrictions on the chip size. Although developed process techniques have reduced sizes of design tools, there is a tendency to increase the chip sizes in accordance with increase in capacity of the DRAMs. For minimizing the chip sizes within an allowed range, it has been attempted to increase division units of bit lines and word lines, and thereby to reduce the number of circuits other than the memory cell arrays. However, this increases the size of the sub-block, and therefore decreases regions where global I/O line pairs can extend. Even if the memory mat increases in size and the sense amplifiers which can be activated at a time increases in number, the number of bits cannot be increased because the number of global I/O line pairs for sending data from the memory cell arrays is restricted.

As an easy manner for ensuring a sufficient bit width, it can be envisaged to allow increase in number of interconnections by increasing a layout area of regions such as sense amplifier region, which are used for local I/O line pairs sending the data from the array mats, and sub-word driver regions or word line shunt regions, which are used for the global I/O line pairs. However, this manner results in increase in chip size.

For overcoming the above problems, such a semiconductor memory device has been proposed that local I/O line pairs are divided into a plurality of groups or sets, and the global I/O line pairs are arranged for divided groups of the local I/O line pairs in a one-to-one relationship, respectively (see U.S. Pat. No. 5,781,495).

In FIG. 2 of the above publication, a large number of global I/O line pairs extend not on word line shunt regions but on memory cell arrays. A plurality of local I/O line pairs are connected to each global I/O line pair. Only one bit line pair is connected to each local I/O line pair. Therefore, the local I/O line pair is directly connected to the global I/O line pair without interposing a switching element therebetween.

In FIG. 5 of the above publication, a large number of global I/O line pairs extend not on the word line shunt regions but on the memory cell arrays. Local I/O line pairs, which correspond to the global I/O line pairs in one-to-one relationship, respectively, are arranged across the global I/O line pairs.

In the semiconductor memory device shown in FIG. 2 of the above publication, only one bit line pair is connected to each local I/O line pair, and only one global I/O line pair is arranged for a plurality of bit line pairs arranged in each column. Therefore, the global I/O line pairs are excessively large in number. Further, this device must employ the global I/O line pairs which correspond to column select lines in a one-to-one relationship, respectively, so that excessively large parasitic capacities occur between these lines, resulting in disadvantageous decrease in operation speed and increase in power consumption.

In the semiconductor memory device shown in FIG. 5 of the above publication, the global I/O line pairs are always equal in number to the local I/O line pairs. Therefore, the number of the global I/O line pairs must be increased for increasing the number of local I/O line pairs, and consequently it is also necessary to increase the number of preamplifiers connected to the global I/O line pairs. Accordingly, this device suffers from the problem that increase in number of the local I/O line pairs causes extreme increase in layout area.

SUMMARY OF THE INVENTION

An object of the invention is to provide a semiconductor memory device allowing input/output of data of multiple bits.

Another object of the invention is to provide a semiconductor memory device, in which a large number of global I/O line pairs are arranged on a memory cell array while suppressing decrease in operation speed and increase in power consumption.

Still another object of the invention is to provide a semiconductor memory device, in which a large number of global I/O line pairs are arranged on a memory cell array while suppressing increase in memory array area.

A semiconductor memory device according to the invention includes a memory cell array. The memory cell array is divided into a plurality of sub-arrays by a plurality of sense amplifier regions each arranged in a row and a plurality of predetermined regions each arranged in a column. The plurality of sub-arrays are arranged in rows and columns. Each of the sub-arrays is divided into a plurality of segments. The plurality of segments are arranged in columns, respectively. Each of the sub-arrays is provided with a plurality of word lines. The plurality of word lines are arranged along the row and extend across the plurality of segments. Each of the segments includes a plurality of bit line pairs, a plurality of sense amplifiers, a plurality of local I/O line pairs and a plurality of column select gates. The plurality of bit line pairs are arranged along the column. The plurality of sense amplifiers are formed on the sense amplifier regions, and correspond to the bit line pairs, respectively. The sense amplifiers are connected to the corresponding bit line pairs, respectively. The plurality of local I/O line pairs are arranged in parallel with the word lines. Each of the column select gates is arranged correspondingly to one of the bit line pairs, and is connected between the corresponding bit line pair and one of the local I/O line pairs. The semiconductor memory device further includes a plurality of column select lines, a plurality of global I/O line pairs and a plurality of switching elements. The plurality of column select lines are arranged in parallel with the bit line pairs and each extend longitudinally through the sub-arrays arranged in the column. Each of the column select lines is provided correspondingly to at least two of the column select gates, and is connected to at least the corresponding two column select gates. The plurality of global I/O line pairs are formed between the plurality of predetermined regions, extend longitudinally through the sub-arrays arranged in the column, are arranged in parallel with the bit line pairs, and cross the plurality of local I/O line pairs. The plurality of switching elements are formed on the sense amplifier regions, and are connected between the plurality of local I/O line pairs and the plurality of global I/O line pairs, respectively.

In the above semiconductor memory device, since the plurality of global I/O line pairs are formed between the predetermined regions, data of multiple bits can be input/output at a time by increasing the number of the global I/O line pairs. However, each of the column select lines is provided correspondingly to at least two of the column select gates, and the plurality of bit line pairs are commonly connected to one of the local I/O line pairs. Therefore, the global I/O line pairs do not excessively increase in number compared with the number of the column select lines so that increase in parasitic capacity between these lines can be suppressed. As a result, it is possible to suppress decrease in operation speed and increase in power consumption. Since the global I/O line pairs are smaller in number than the local I/O line pairs, only the local I/O line pairs can be increased in number without increasing the number of the global I/O line pairs. As a result, it is not necessary to increase the number of preamplifiers connected to the global I/O line pairs, and increase in layout area can be suppressed even if the local I/O line pairs are increased.

Preferably, the semiconductor memory device further includes a first sense amplifier drive line connected to the plurality of sense amplifiers. Each of the switching elements includes a transistor having a gate connected to the first sense amplifier drive line.

Accordingly, it is not necessary to add signal lines for controlling the switching elements so that increase in layout area can be suppressed.

Preferably, each of the switching elements includes P- and N-channel MOS transistors connected together in parallel.

Accordingly, it is possible to reduce a voltage drop which may be caused by the switching elements, and data can be stably transferred between the global I/O line pairs and the local I/O line pairs.

Preferably, the semiconductor memory device further includes a second sense amplifier drive line connected to the plurality of sense amplifiers. Each of the sense amplifiers includes two N-channel MOS transistors connected together and two P-channel MOS transistors connected together. The first sense amplifier drive line is connected to sources of the two N-channel MOS transistors of the sense amplifier. The second sense amplifier drive line is connected to sources of the two P-channel MOS transistors of the sense amplifier. The gate of the N-channel MOS transistor of the switching element is connected to the first sense amplifier drive line, and the gate of the P-channel MOS transistor of the switching element is connected to the second sense amplifier drive line.

Accordingly, it is not necessary to add signal lines for controlling the switching elements so that increase in layout area can be suppressed.

Preferably, the gate of the transistor is arranged to cross at least two of the bit line pairs.

Accordingly, the transistor has an increased gate length and an increased channel width. Therefore, voltage drop by the transistor can be reduced, and data can be transferred stably between the global I/O line pairs and the local I/O line pairs.

Preferably, one of the paired global I/O lines and the other are arranged alternately with the column select lines.

Accordingly, it is possible to suppress increase in parasitic capacity between the global I/O lines and the column select lines. Consequently, it is possible to suppress decrease in operation speed and increase in power consumption.

Preferably, at least two of the column select lines neighbor to each other. The global I/O line pairs are arranged on the opposite sides of the column select lines neighboring to each other.

Since the global I/O line pairs are spaced from each other, it is possible to suppress increase in parasitic capacity between the global I/O lines and the column select lines so that decrease in operation speed and increase in power consumption can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described below with reference to the drawings. In the figures, the same or corresponding portions bear the same reference numbers, and description thereof will not be repeated.

Embodiment 1

Figure 1:
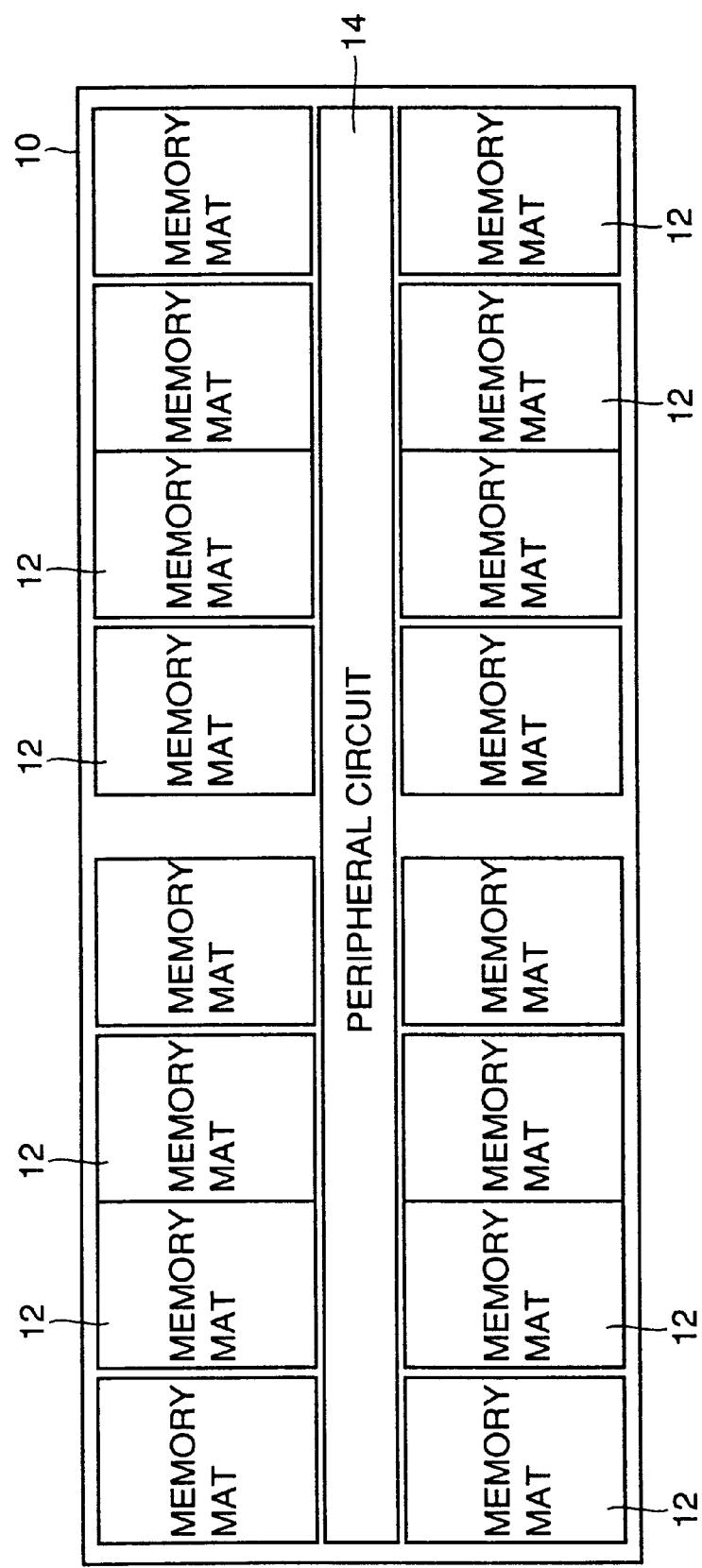
FIG. 1 is a layout diagram showing a whole structure of a DRAM according to an embodiment 1 of the invention.

FIG. 1 is a layout diagram showing a whole structure of a DRAM according to an embodiment 1 of the invention. Referring to FIG. 1, a DRAM 10 includes 16 memory mats (memory cell arrays) 12 and a peripheral circuit 14 controlling read/write of memory mats 12. Peripheral circuit 14 extends laterally through a central region of the chip. Eight memory mats 12 are arranged on each of the opposite sides of peripheral circuit 14. Each memory mat 12 has a storage capacity of 16 Mbits, and therefore DRAM 10 has a storage capacity of 256 Mbits as a whole.

Figure 2:
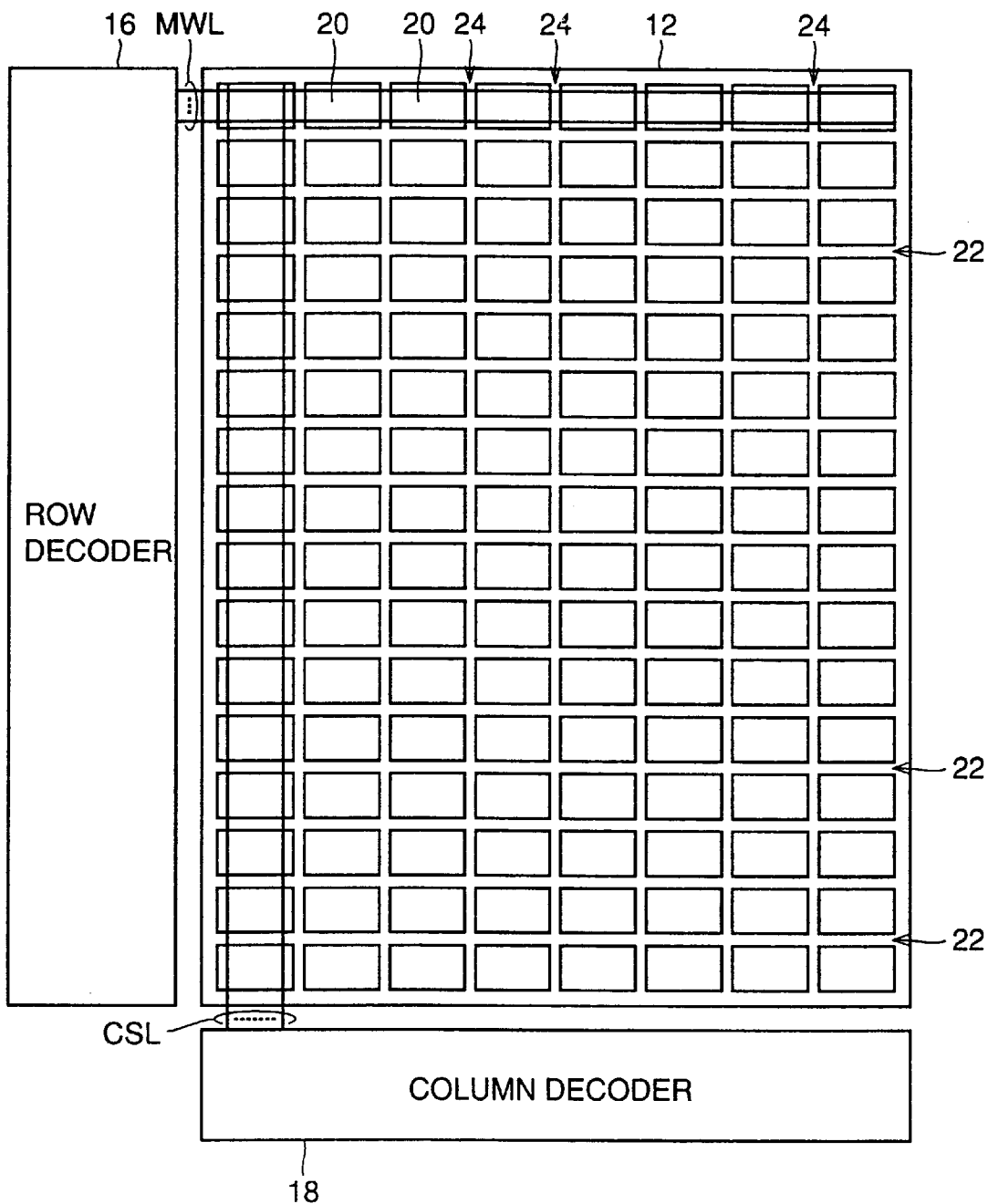
FIG. 2 is a layout diagram showing a specific structure of one of memory mats shown in FIG. 1.

FIG. 2 is a layout diagram showing a specific structure of one of memory mats 12 shown in FIG. 1. Referring to FIG. 2, a row decoder 16 and a column decoder 18 are arranged near memory mat 12. The memory mat 12 has sub-arrays 20 of 128 (=16×8) in number. Thus, memory mat 12 is divided into 128 sub-arrays 20 by a plurality of sense amplifier regions 22 and a plurality of sub-word driver regions 24. Each sense amplifier region 22 is arranged along a row, and each sub-word driver region 24 is arranged along a column. Accordingly, sub-arrays 20 are arranged in a matrix formed of 16 rows and 8 columns. In this embodiment, each sub-array 20 has a storage capacity of 128 Kbits.

DRAM 10 has a divided word line structure, in which a plurality of main word lines MWL, each of which is arranged along the row and extends laterally through sub-arrays 20, are connected to row decoder 16. Row decoder 16 selects and activates main word lines MWL in response to a row address signal. A plurality of column select lines CSL, each of which extends longitudinally through sub-arrays 20 and is arranged along the column, are connected column decoder 18. Column decoder 18 selects and activates column select lines CSL.

Figure 3:
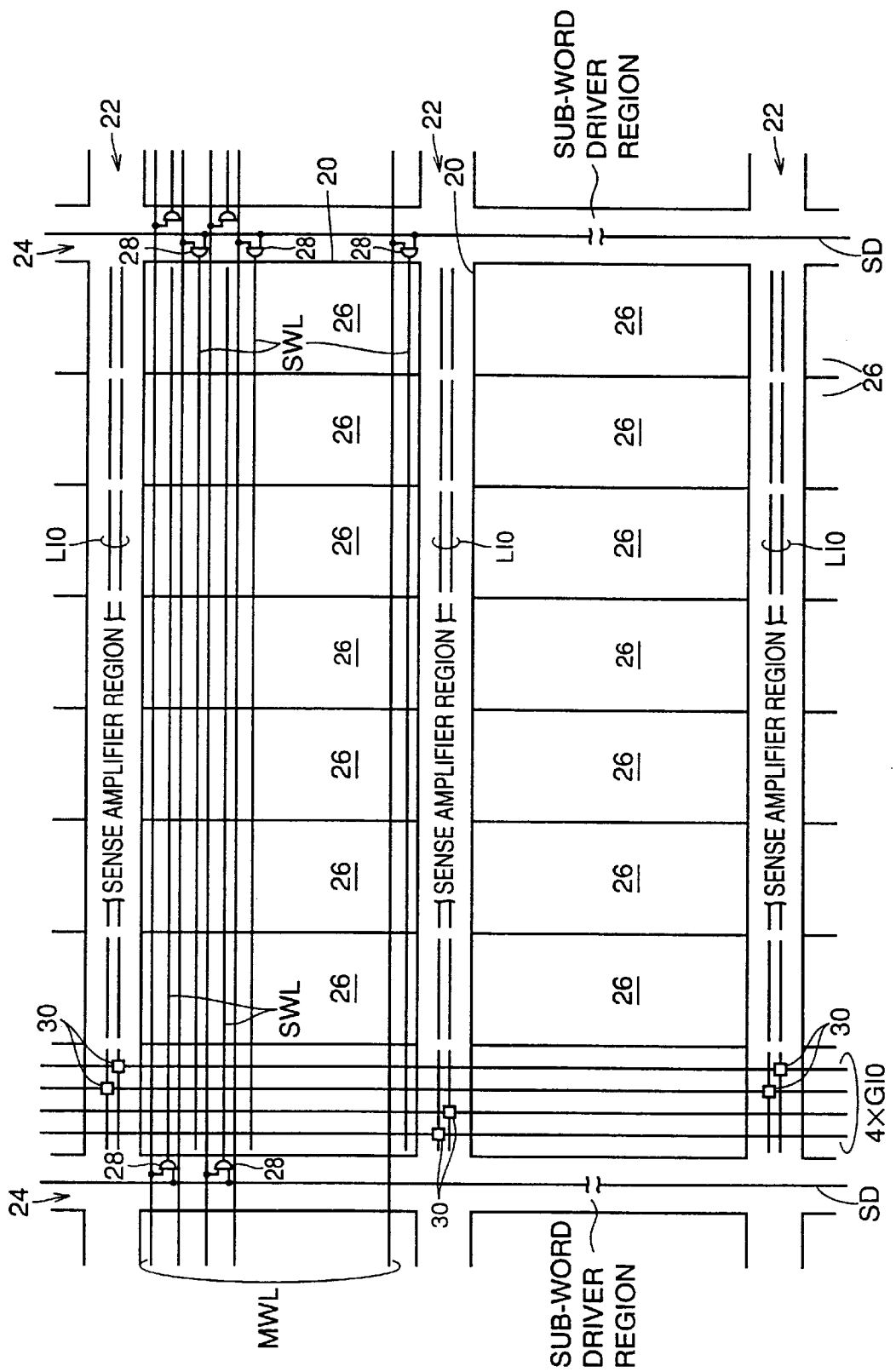
FIG. 3 is a layout diagram showing specific structures of two of the sub-arrays shown in FIG. 2.

FIG. 3 is a layout diagram showing a specific structure of two of the sub-arrays shown in FIG. 2. In FIG. 3, each of local I/O line pairs LIO and global I/O line pairs GIO is simply depicted by one line.

Referring to FIG. 3, each sub-array 20 is divided into 8 memory sub-blocks (segments) 26. These 8 memory sub-blocks 26 are arranged in columns, respectively. Sub-word lines SWL of 512 in number, each of which extends laterally through these eight memory sub-blocks 26, are arranged along the row. A plurality of sub-word drivers 28 for selecting and activating sub-word lines SWL are formed on sub-word driver regions 24. Sub-word drivers 28 are connected to 512 sub-word lines SWL in sub-arrays 20, respectively, and each are connected to main word line MWL extending laterally through 8 sub-arrays 20 arranged in the row. Sub-word drivers 28 are also connected commonly to the sub-decode signal line SD extending on sub-word driver region 24. In each sub-array 20, one sub-word line SWL is provided correspondingly to one main word line MWL. Alternatively, a plurality of sub-word lines SWL may be provided correspondingly to one main word line MWL.

A plurality of local I/O line pairs LIO are arranged correspondingly to each sub-array 20. Local I/O line pairs LIO for each sub-array 20 do not have a continuous structure, but are divided into a plurality of portions. More specifically, two local I/O line pairs LIO are arranged on each of the opposite sides of each memory sub-block 26. Local I/O line pair LIO is formed on sense amplifier region 22. Local I/O line pairs LIO formed on each sense amplifier region 22 are commonly used by two sub-arrays 20 arranged on the opposite sides of the same.

Global I/O line pairs GIO of 32 (=4×8) longitudinally extend through 16 sub-arrays 20 arranged in one column. In each sub-array 20, four global I/O line pairs GIO are arranged correspondingly to each memory sub-block 26. These global I/O line pairs GIO extend over the memory cell arrays between sub-word driver regions 24. Global I/O line pairs cross local I/O line pairs LIO, and are connected to local I/O line pairs via switching elements 30 arranged in the crossings between them, respectively. Switching elements 30 are formed on sense amplifier regions 22.

Figure 4:
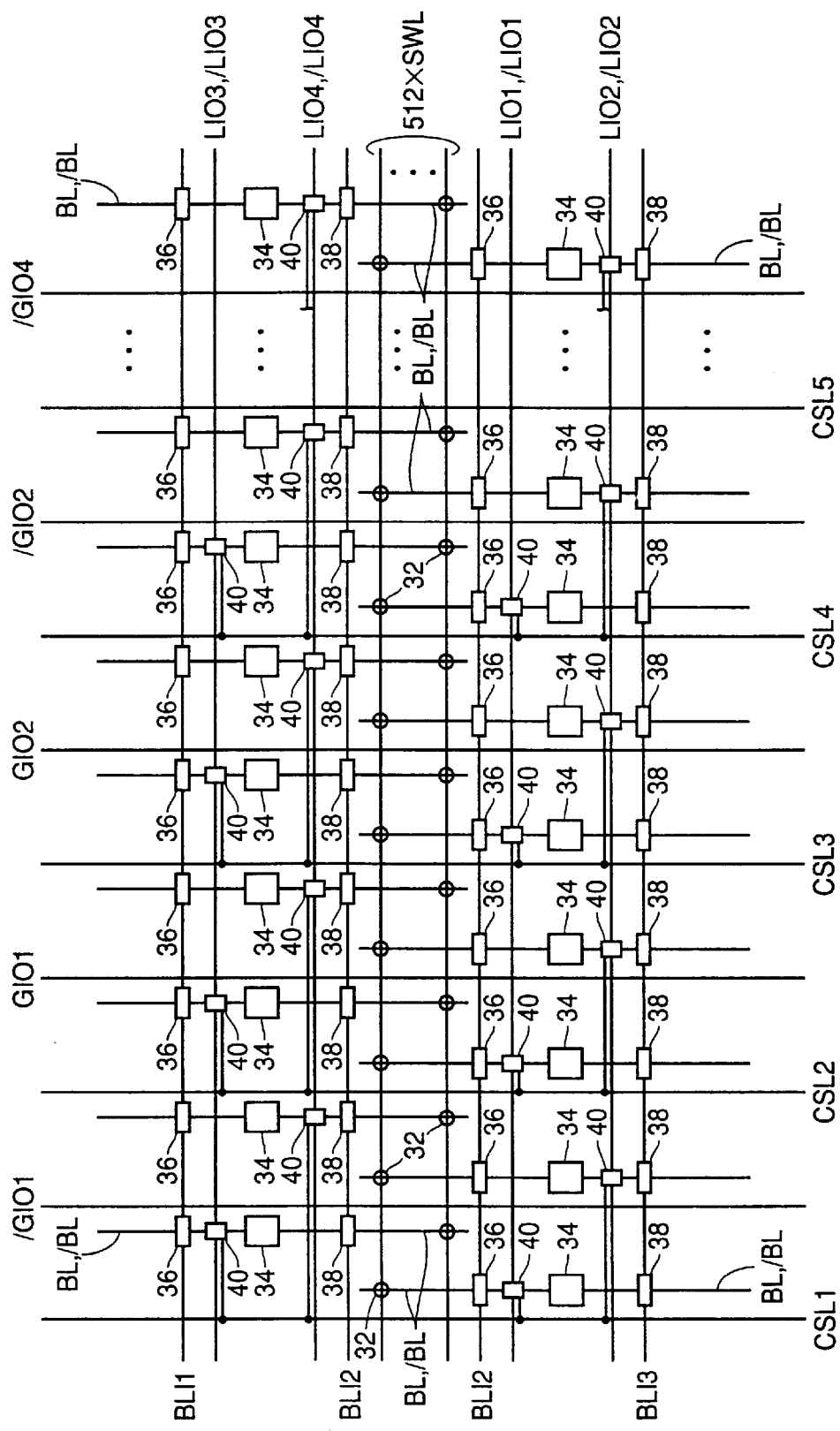
FIG. 4 is a wiring diagram showing a specific structure of one of memory sub-rays shown in FIG. 3.

FIG. 4 is a wiring diagram showing a specific structure of the memory sub-block shown in FIG. 3. In FIG. 4, each of local I/O line pairs LIO1 and /LIO1–LIO4 and /LIO4 as well as bit line pair BL and /BL is simply depicted by one line.

Referring to FIG. 4, the plurality of bit line pairs BL and /BL are arranged along the column, and extend across the plurality of sub-word lines SWL. A memory cell 32 is arranged in each crossing between the sub-word line SWL and bit line pair BL and /BL, and is connected to the sub-word line SWL and bit line pair BL and /BL. Accordingly, memory cells 32 are arranged in a matrix formed of rows and columns. A plurality of sense amplifiers 34 are arranged correspondingly to bit line pairs BL and /BL. Each sense amplifier 34 is commonly used by two bit line pairs BL and /BL arranged on the opposite sides thereof. Thus, each sense amplifier 34 is connected to bit line pair BL and /BL on one side thereof via a share gate 36, and is also connected to bit line pair BL and /BL on the other side via a share gate 38. In an operation of selecting the sub-array shown in FIG. 4, shared gates 36 and 38 are turned on in response to a signal BLI2, and shared gates 36 and 38 are turned off in response to signals BLI1 and BLI3. Each sense amplifier 34 amplifies a potential difference occurring between bit lines BL and /BL connected by share gate 36 or 38.

A plurality of column select gates 40 are arranged in crossings between bit line pairs BL and /BL and local I/O line pairs LIO1 and /LIO1–LIO4 and /LIO4, respectively. Each column select gate 40 is connected between corresponding bit line pair BL and /BL and corresponding one of local I/O line pairs LIO1 and LIO1–LIO4 and /LIO4. Each of column select lines CSL1–CSL5 arranged in parallel with bit line pairs BL and BL corresponds to four column select gates 40. These column select lines 40 are commonly connected to corresponding one among column select lines CSL1–CSL5. Accordingly, four column select lines 40 are simultaneously turned on when column decoder 18 shown in FIG. 2 supplies a column select signal onto one of the column select lines.

Figure 5:
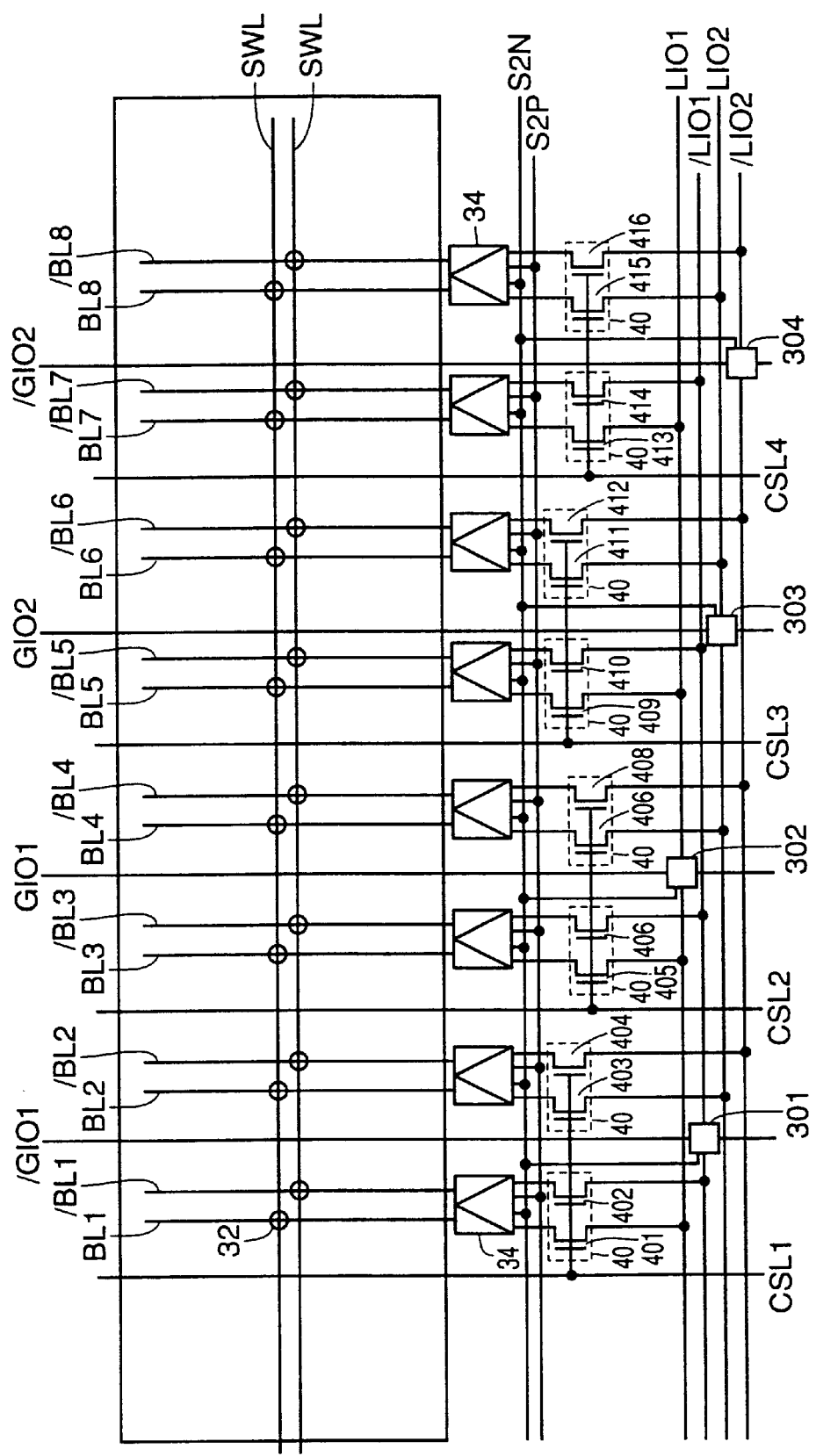
FIG. 5 is a wiring diagram fragmentarily showing a more specific structure of the structure shown in FIG. 4.

FIG. 5 is a wiring diagram showing more specifically a portion of the structure shown in FIG. 4. FIG. 5 shows only eight sense amplifiers 34 arranged on one side of the memory sub-block as well as elements related to them. Share gates 36 and 38 in FIG. 4 are not shown in FIG. 5.

Referring to FIG. 5, each column select gate 40 is formed of two N-channel MOS transistors 401–416. Transistor 401 is connected between bit line BL1 and local I/O line LIO1. Transistor 402 is connected between bit line /BL and local I/O line /LIO1. Gates of four transistors 401–404 in two column select gates 40 neighboring to each other are commonly connected to corresponding one column select line CSL1. Other column select gates 40 have similar structures.

As shown in FIGS. 4 and 5, global I/O lines /GIO1, GIO1, GIO2, /GIO2, . . . and /GIO4 are arranged alternately with column select lines CSL1, CSL2, CSL3, CSL4, CSL5, . . . . As shown in FIG. 5, transistors 301–304 are arranged in the crossings between global I/O lines /GIO1, GIO1, /GIO2 and GIO2 and local I/O lines /LIO1, LIO1, /LIO2 and LIO2, respectively. Two transistors 301 and 302, or 303 and 304 form switching element 30 shown in FIG. 30. Transistor 302 or 303 is connected between global I/O line GIO1 or GIO2 and local I/O line LIO1 or LIO2. Transistor 301 or 304 is connected between global I/O line /GIO1 or /GIO2 and local I/O line /LIO1 or /LIO2.

The plurality of sense amplifiers 34 are connected commonly to sense amplifier drive lines S2N and S2P. The plurality of transistors 301–304 are connected commonly to sense amplifier drive line S2N. When the voltage on sense amplifier drive line S2N is pulled up to the power supply voltage level, these transistors are turned on.

Figure 6:
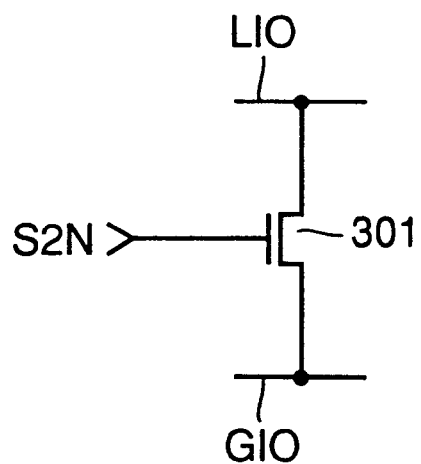
FIG. 6 is a circuit diagram specifically showing a switching element shown in FIG. 5.

Each of transistors 301–304 is formed of one N-channel MOS transistor 301 as shown in FIG. 6. Transistor 301 is connected between local I/O line LIO and global I/O line GIO, and has a gate connected to sense amplifier drive line S2N.

Figure 7:
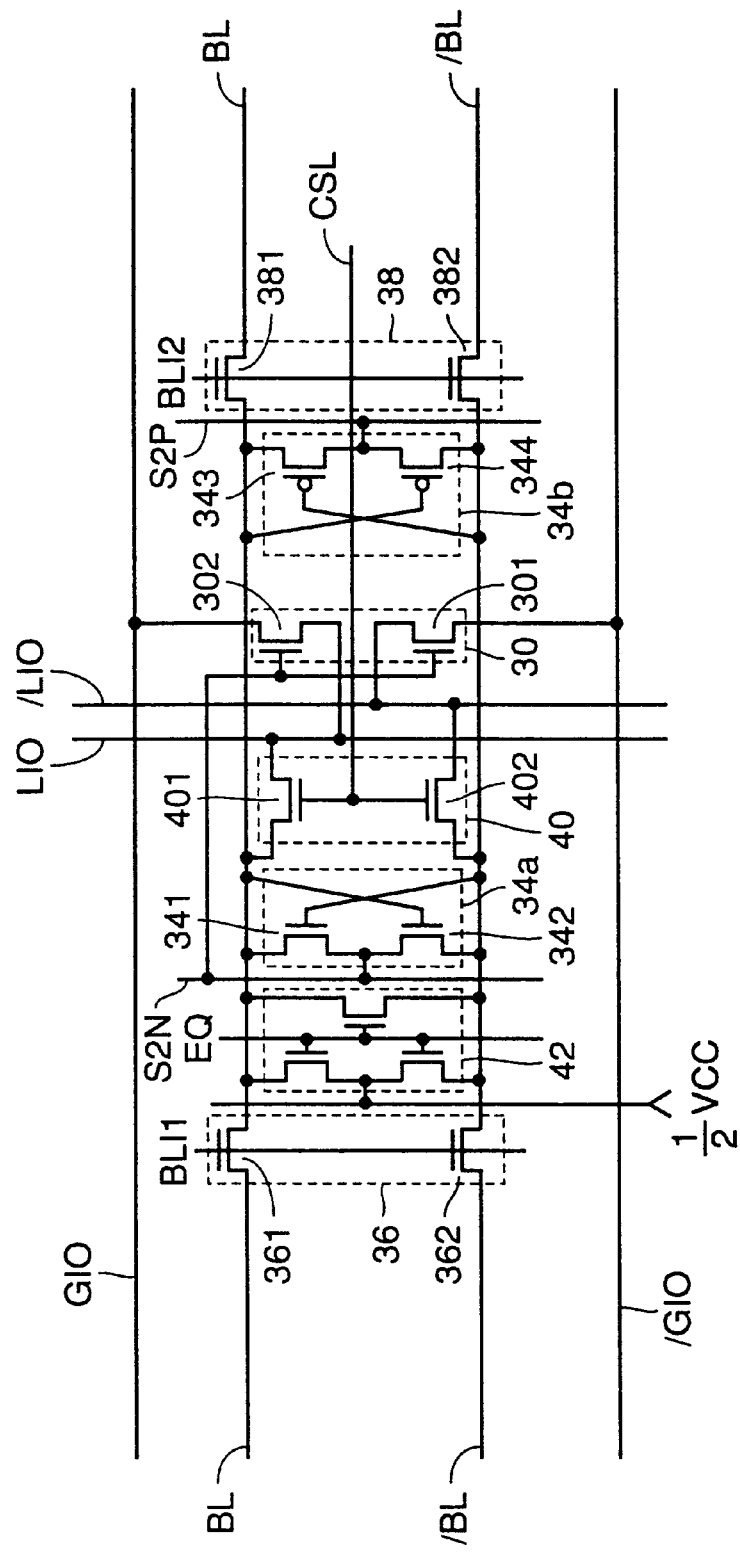
FIG. 7 is a circuit diagram fragmentarily showing a more specific structure of the structure shown in FIG. 4.

FIG. 7 is a circuit diagram showing more specifically a portion of the structure shown in FIG. 4. Referring to FIG. 7, each sense amplifier 34 shown in FIGS. 4 and 5 is divided into N- and P-channel sense amplifiers 34a and 34b. N-channel sense amplifier 34a includes mutually connected two N-channel MOS transistors 341 and 342. Sense amplifier drive line S2N is connected to sources of mutually connected two transistors 341 and 342. P-channel sense amplifier 34b includes mutually connected two P-channel MOS transistors 343 and 344. Sense amplifier drive line S2P is connected to sources of mutually connected transistors 343 and 344.

Shared gate 36 includes N-channel MOS transistors 361 and 362 which are turned on in response to signal BLI1. Shared gate 38 includes N-channel MOS transistors 381 and 382 which are turned on in response to signal BLI2. Bit line pair BL and /BL is connected to precharge/equalize circuit 42, which precharges and equalizes bit line pair BL and /BL to a predetermined voltage of VCC/2 in response to an equalize signal EQ.

In the above DRAM, column decoder 18 activates one of column select lines CSL for each memory sub-block 26. Therefore, column decoder 18 simultaneously selects eight column select lines CSL in one sub-array 20. When column select line CSL1 is activated, e.g., in the memory sub-block shown in FIG. 4, corresponding four column select gates 40 are turned on, and data is read out from four bit line pairs BL and /BL onto local I/O line pairs LIO1 and /LIO1–LIO4 and /LIO4, respectively. The data thus read is transferred onto global I/O line pairs GIO1 and /GIO1–GIO4 and /GIO4 through switching elements 30 (FIG. 3), respectively. Since data of 4 bits is output from one memory sub-block 26, data of 32 (=4×8) bits is output from sub-array 20, as a whole.

Figure 8:
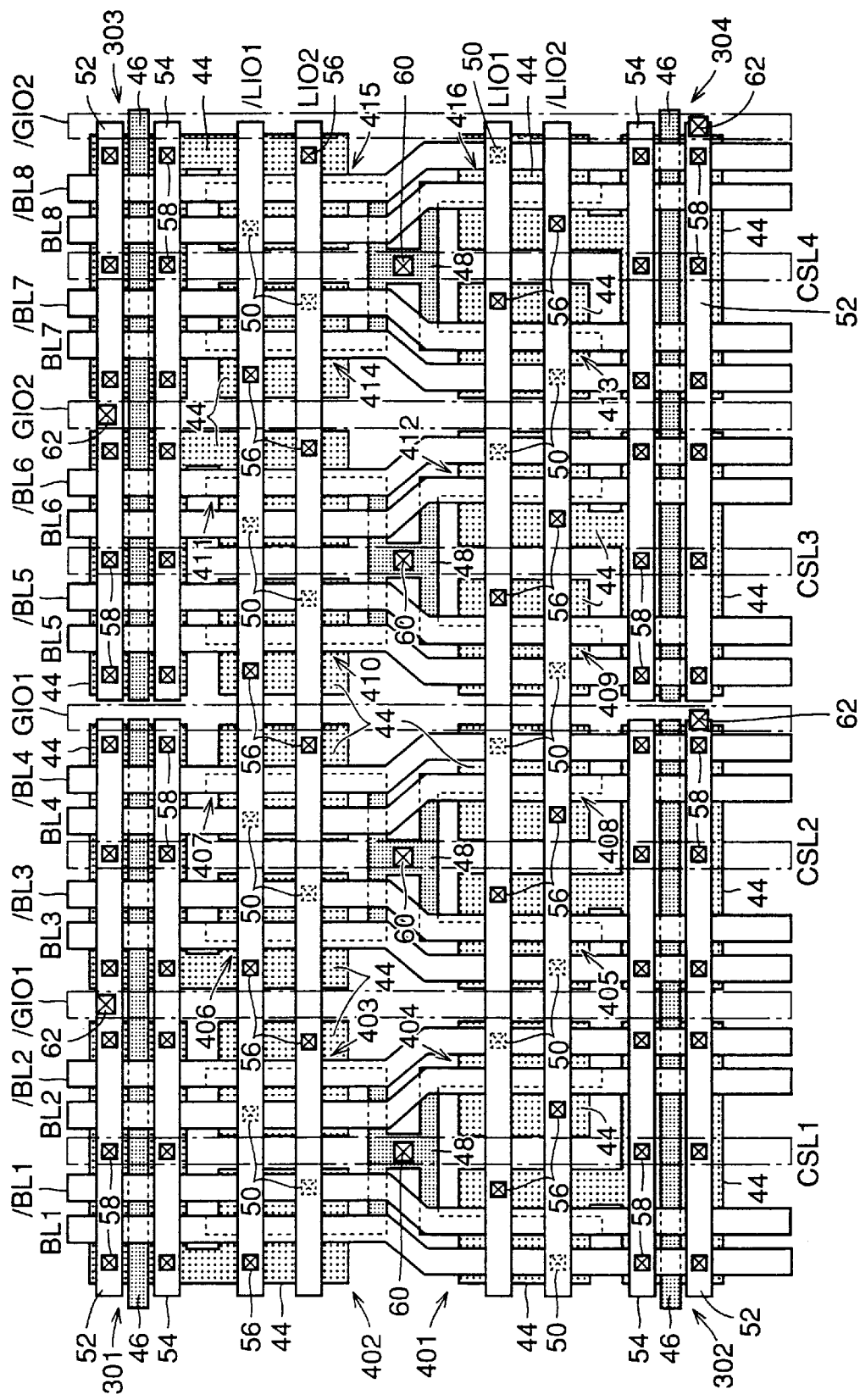
FIG. 8 is a plan showing specific a structure of column select gates and switching elements shown in FIG. 5.

FIG. 8 is a plan showing structures of transistors 401–416 forming column select gates 40 and transistors 301–304 forming switching elements 30.

Referring to FIG. 8, a semiconductor substrate is provided at its main surface with active regions 44 of transistors 301–304 and 401–416. Gate electrodes 46 of transistors 301–304 and gate electrodes 48 of transistors 401–416 are formed on active regions 44. Bit line pairs BL1 and /BL1–BL8 and /BL8 are formed on gate electrodes 46 and 48. Bit line pairs BL1 and /BL1–BL8 and /BL8 are connected to active regions 44 of transistors 401–416 through contact holes 50, respectively. Local I/O line pairs LIO1 and /LIO1, and LIO2 and /LIO2 formed of a first aluminum layer are arranged above bit line pairs BL1 and /BL1–BL8 and /BL8. A source line 52 and a drain line 54, which short-circuit source regions and drain regions of transistors 301–304, are made of this first aluminum layer. Local I/O line pairs LIO1 and /LIO1, and LIO2 and /LIO2 are connected to active regions 44 of transistors 401–416 through contact holes 56. Source lines 52 and drain lines 54 are connected to active regions 44 of transistors 301–304 through contact holes 58. Column select lines CSL1–CSL4 and global I/O line pairs GIO1 and /GIO1, and GIO2 and /GIO2 made of a second aluminum layer are arranged above local I/O line pairs LIO1 and /LIO1, and LIO2 and /LIO2. Column select lines CSL1–CSL4 are connected to gate electrodes 48 of transistors 401–416 via through-holes 60. Global I/O line pairs GIO1 and /GIO1, and GIO2 and /GIO2 are connected to source lines 52 via through-holes 62.

Active region 44 of transistor 301 is divided into two. One active region 44 is formed over two bit line pairs BL1 and /BL1, and BL2 and /BL2, and the other active region 44 is formed over two bit line pairs BL3 and /BL3, and BL4 and /BL4. However, gate electrode 46 of transistor 301 is formed over four bit line pairs BL1 and /BL1 to BL4 and /BL4. Other transistors 302–304 have similar structures. As described above, each of transistors 301–304 has gate electrode 46 formed over four bit line pairs, and therefore has a large channel width so that voltage drop caused by these transistors 301–304 is small.

Although each of transistors 301–304 has the active region divided into two, each transistor may have one continuous active region. Gate electrode 46 of each of transistors 301–304 is required only to be longer than the usual gate electrode, and may have a structure crossing only three or two bit line pairs.

According to the embodiment 1, as described above, local I/O line pairs LIO in each sub-array 20 are divided correspondingly to respective memory sub-blocks 26, and a large number of global I/O line pairs GIO extend over the memory cell array between the sub-word driver regions 24. Therefore, data of many bits can be input/output simultaneously.

The four bit line pairs are simultaneously selected by activating one column select line, and the selected bit line pairs are connected to the four local I/O line pairs, respectively. Therefore, this can suppress increase in number of the global I/O line pairs extending parallel with the column select lines. The column select lines can be arranged alternately with the global I/O lines so that increase in parasitic capacity which may occur between them can be suppressed. As a result, decrease in operation speed and increase in power consumption can be suppressed.

The global I/O line pairs are not equal in number to the local I/O line pairs in contrast to the structure shown in FIG. 5 of the foregoing U.S. Pat. No. 5,781,495, and it is not necessary to increase the number of the global I/O line pairs even if the local I/O line pairs are increased in number. Accordingly, main amplifiers connected to the global I/O line pairs do not increase in number so that increase in layout area can be suppressed.

Since gates of transistors 301–304 are commonly connected to sense amplifier drive line S2N, it is not necessary to add signal lines for controlling transistors 301–304 so that increase in layout area can be suppressed.

Since each of transistors 301–304 forming switching elements 30 has gate electrode 46 extending over the four bit line pairs, voltage drop which may be caused by transistors 301–304 can be suppressed. Accordingly, data can be accurately transferred between global I/O line pair GIO and local I/O line pair LIO even if switching elements 30 are formed in a narrow region such as sense amplifier region 22.

Embodiment 2

Figure 9:
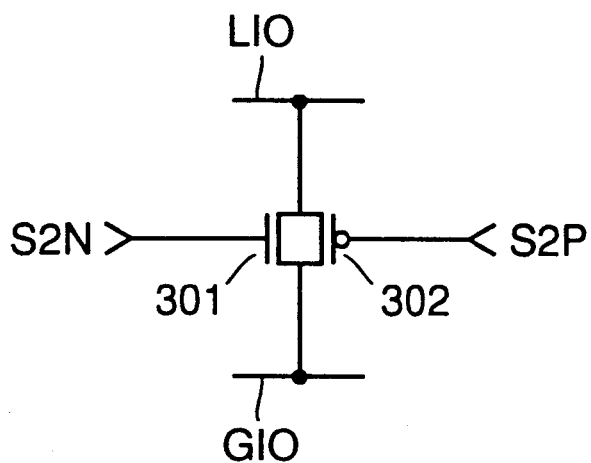
FIG. 9 is a circuit diagram showing a structure of a switching element in a DRAM of a second embodiment of the invention.

In the embodiment 1 described above, N-channel MOS transistors 301 may be used as switching element 30. Alternatively, N-channel MOS transistor 301 and P-channel MOS transistor 302 may be used, as shown in FIG. 9. Transistors 301 and 302 are connected between local I/O line LIO and global I/O line GIO. Transistor 301 has a gate connected to sense amplifier drive line S2N, and transistor 302 has a gate connected to sense amplifier drive line S2P.

When the voltage on sense amplifier drive line S2N is pulled up to the power supply voltage level and the voltage on sense amplifier drive line S2P is pulled down to the switch voltage level, these transistors 301 and 302 are turned on. Thereby, data is transferred between local I/O line pair LIO and global I/O line GIO.

According to the embodiment 2, as described above, switching element 30 is formed of the CMOS transistors, voltage drop which may be caused by transistors 301 and 302 can be suppressed so that data can be accurately and stably transferred between local I/O line pair LIO and global I/O line pair GIO.

In the embodiments 1 and 2, sense amplifier drive lines S2N and S2P are used. Alternatively, a signal selecting this sub-array 20 may be used.

Embodiment 3

Figure 10:
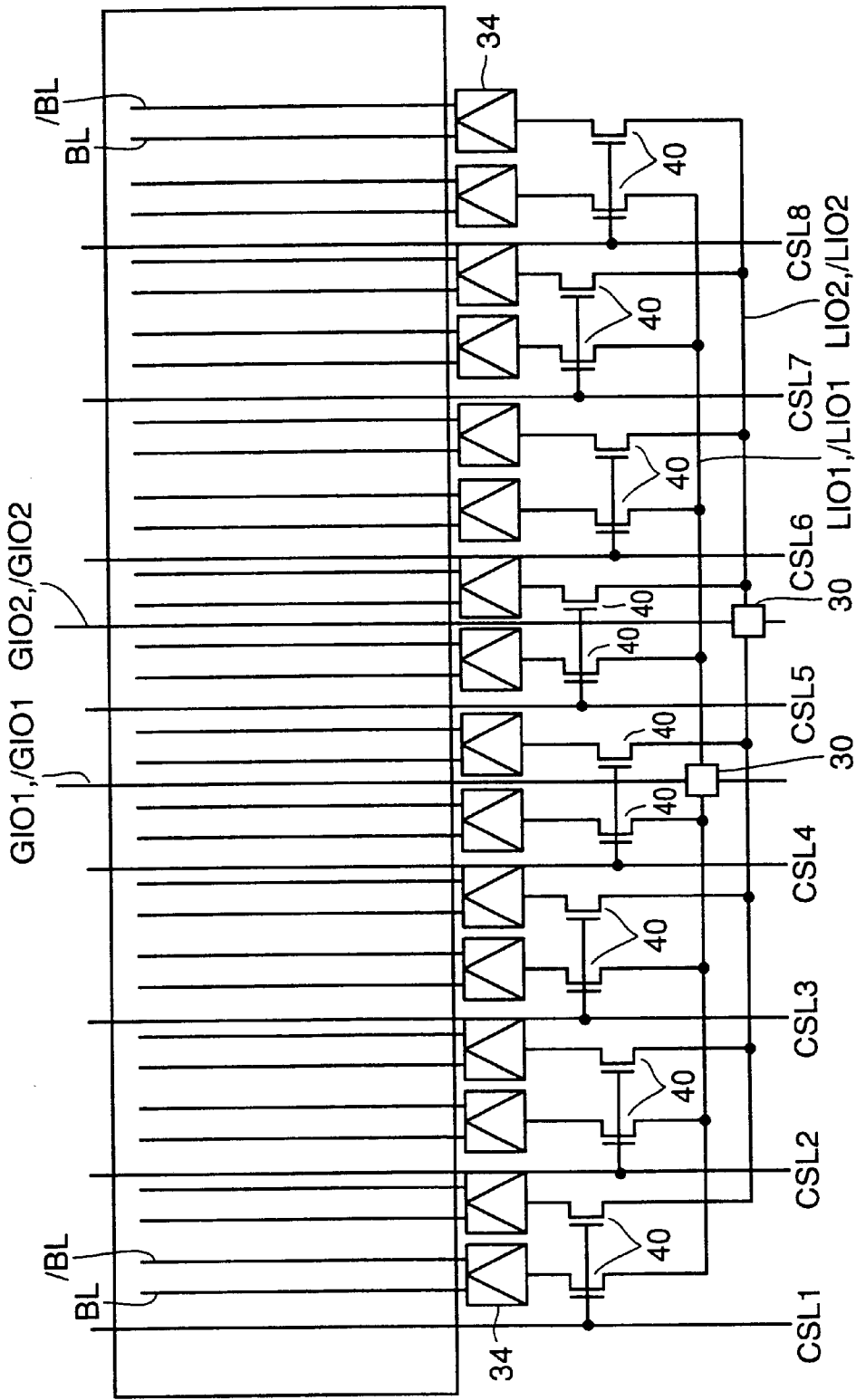
FIG. 10 is a wiring diagram showing a structure of a memory sub-block in a DRAM of an embodiment 3 of the invention.

In the foregoing embodiment 1, the global I/O lines and the column select lines are arranged alternately. The arrangement is not restricted to this, and another arrangement, e.g., shown in FIG. 10 may be employed. In FIG. 10, global I/O line pair GIO1 and /GIO1 is arranged between column select lines CSL4 and CSL5, and another global I/O line pair GIO2 and /GIO2 is arranged between column select lines CSL5 and CSL6.

In FIG. 10, each of global I/O line pairs GIO1 and /GIO1, and GIO2 and /GIO2 as well as local I/O line pairs LIO1 and /LIO1, and LIO2 and /LIO2 is simply depicted by one line. Each column select gate 40 is representatively depicted by one transistor.

Embodiment 4

Figure 11:
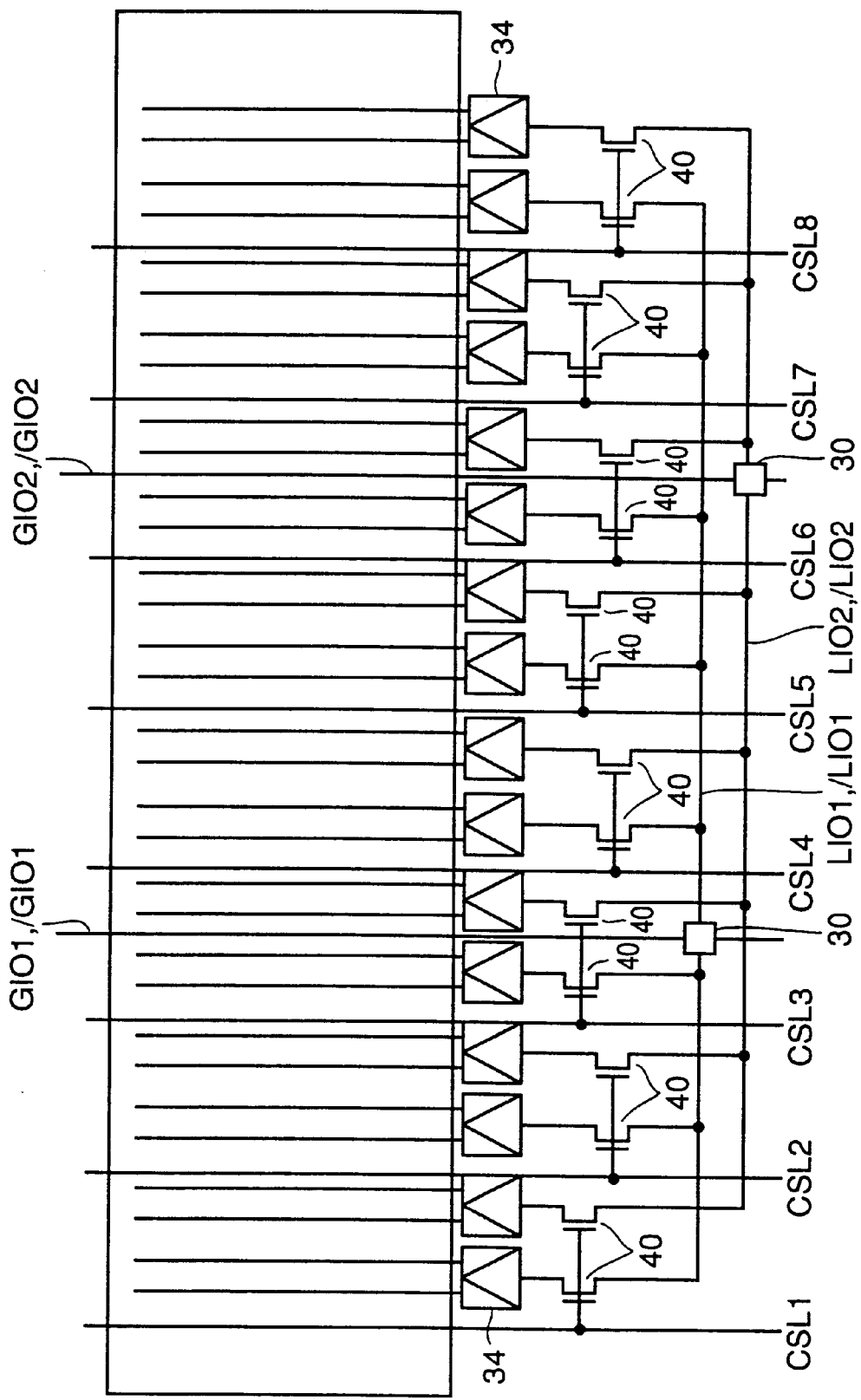
FIG. 11 is a wiring diagram showing a structure of a memory sub-block in a DRAM of an embodiment 4 of the invention.

In the embodiment 3 shown in FIG. 10, global I/O line pair GIO1 and /GIO1 is arranged close to global I/O line pair GIO2 and /GIO2. However, it is desired to increase a space between them as large as possible. For example, as shown in FIG. 11, column select lines CSL4–CSL6 are arranged in positions neighboring to each other, and global I/O line pairs GIO1 and /GIO1, and GIO2 and /GIO2 are arranged on the opposite sides of these column select lines CSL4–CSL6 neighboring to each other. More specifically, global I/O line pair GIO1 and /GIO1 is arranged between column select lines CSL3 and CSL4, and global I/O line pair GIO2 and /GIO2 is arranged between column select lines CSL6 and CSL7.

According to the embodiment 4, as described above, global I/O line pairs GIO1 and /GIO1, and GIO2 and /GIO2 are spaced by a long distance from each other. Therefore, a parasitic capacity which may occur between them can be reduced so that decrease in operation speed and increase in power consumption can be suppressed.

Embodiment 5

Figure 12:
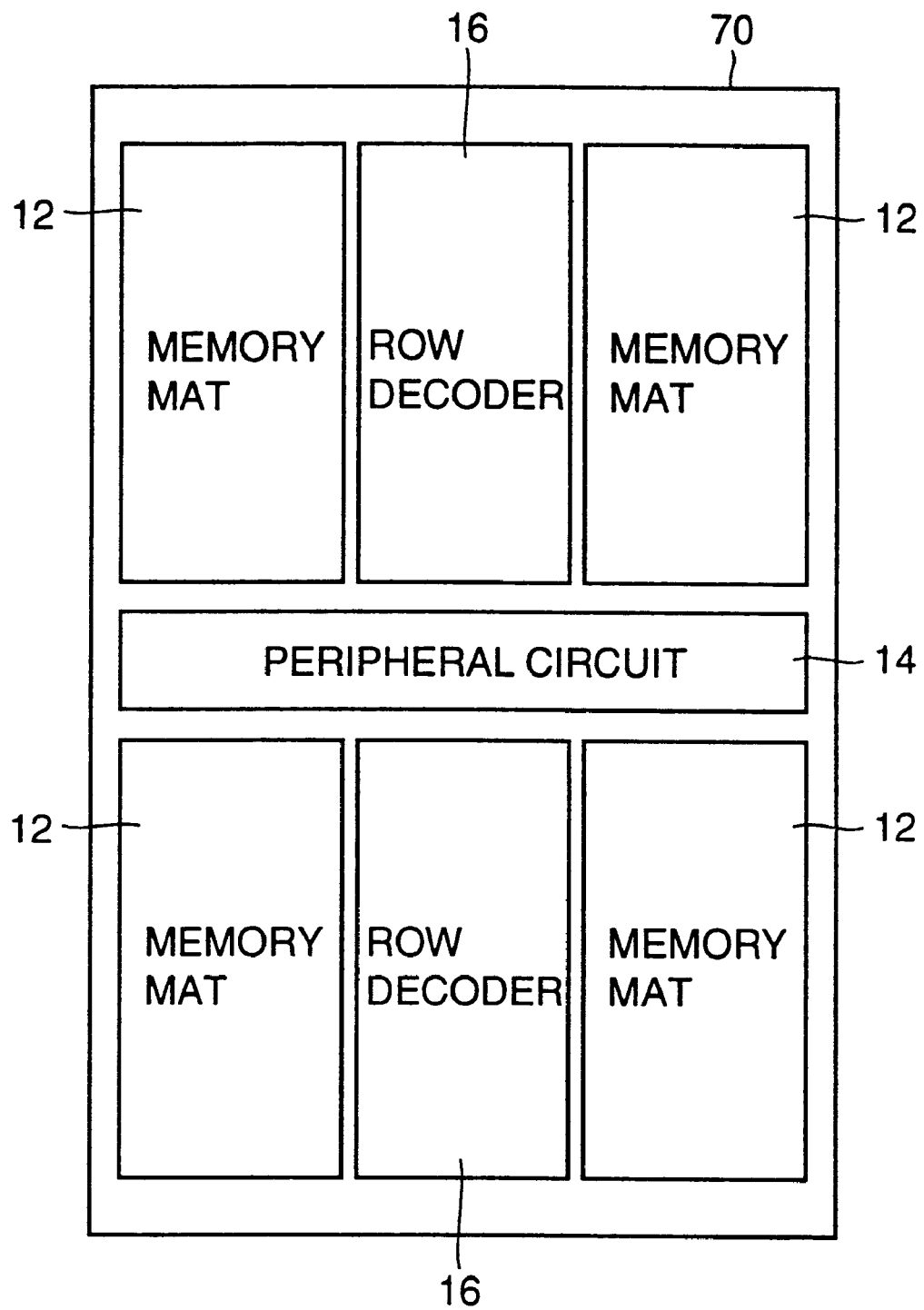
FIG. 12 is a layout diagram showing a whole structure of a DRAM of an embodiment 5 of the invention.

FIG. 12 is a layout diagram showing a whole structure of a DRAM according to an embodiment 5 of the invention. Referring to FIG. 12, a DRAM 70 differs from that of the embodiment 1 shown in FIG. 1 in that DRAM 70 includes four memory mats 12. Each memory mat 12 has a storage region of 16 Mbits, and two memory mats 12 are arranged on each side of the peripheral circuit 14.

Figure 13:
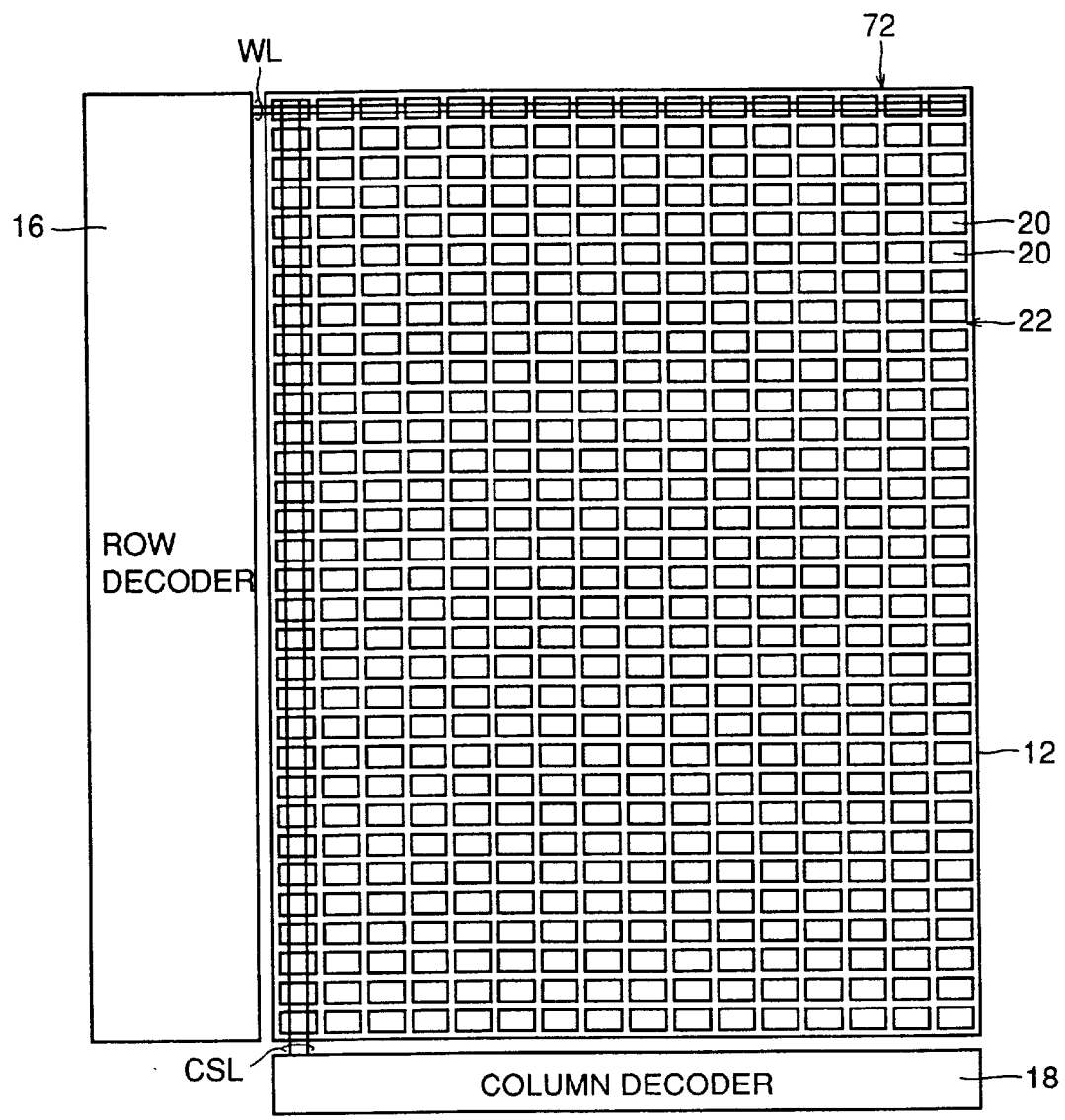
FIG. 13 is a layout diagram showing a specific structure of one of memory mats shown in FIG. 12.

FIG. 13 is a layout diagram showing a structure of one of memory mats 12 shown in FIG. 12. Referring to FIG. 13, memory mat 12 differs from that of the embodiment 1 shown in FIG. 2 in that it has sub-arrays 20 of 512 (=32×16) in number. Since DRAM 70 does not have the divided word line structure in contrast to the foregoing DRAMs, word line shunt regions 72 are arranged instead of sub-word driver regions 24 already described. Thus, memory mat 12 is divided into 512 sub-arrays 20 by sense amplifier regions 22 and word line shunt regions 72. Each word line WL extends across 16 sub-arrays 20 arranged in one row.

Figure 14:
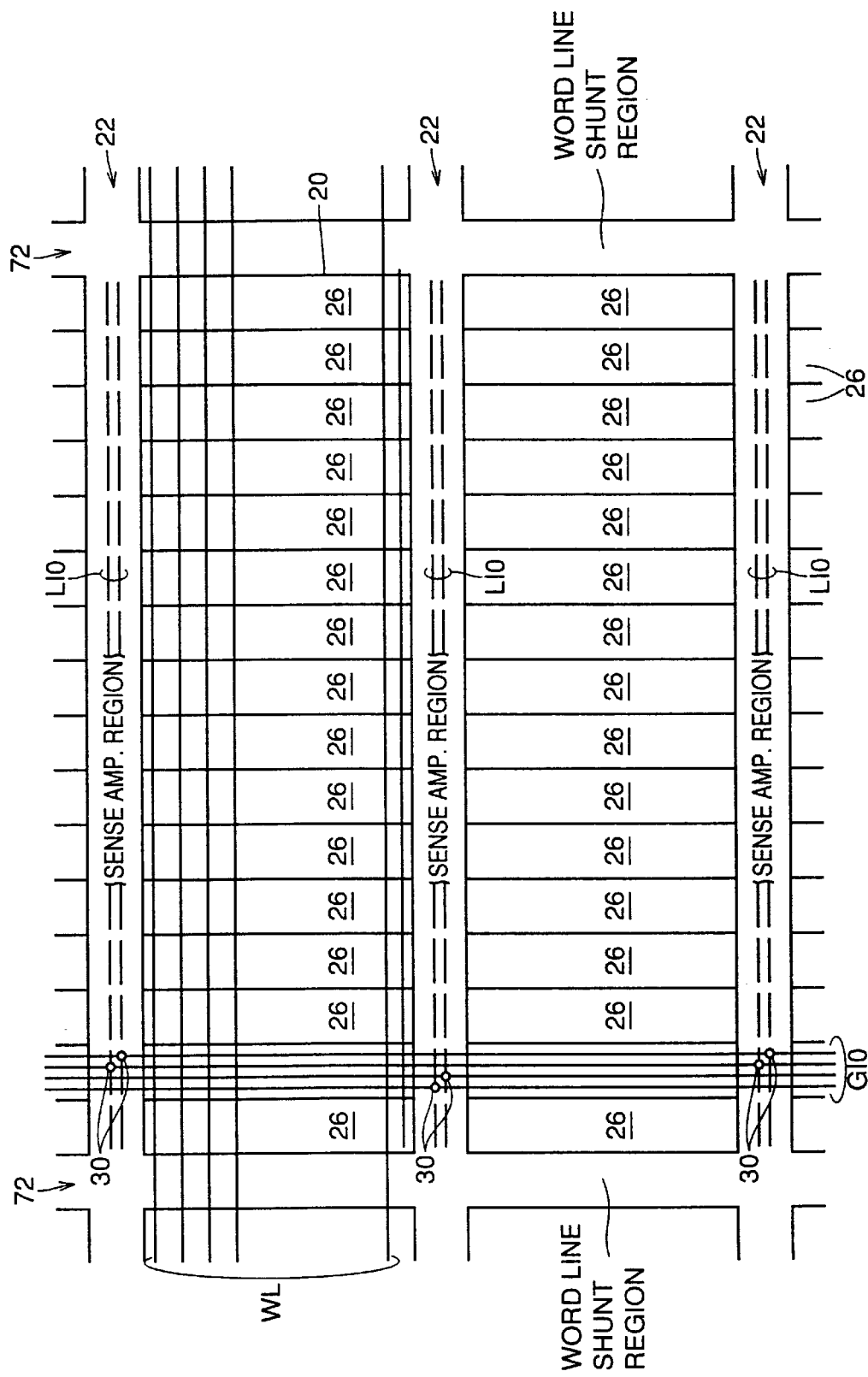
FIG. 14 is a layout diagram showing a specific structure of two of sub-arrays shown in FIG. 13.

FIG. 14 is a layout diagram showing a specific structure of two of sub-arrays 20 shown in FIG. 13. In contrast to the embodiment 1 shown in FIG. 3, the word line is not divided correspondingly to the sub-arrays, but each word line WL extends through all sub-arrays 20 arranged in one row as shown in FIG. 14. Memory cells (not shown in FIG. 14) are arranged in crossings between word lines WL and bit line pairs (not shown in FIG. 14), respectively. Sub-array 20 is divided into 16 memory sub-blocks 26, which is also a difference from the embodiment 1 shown in FIG. 14.

Figure 15:
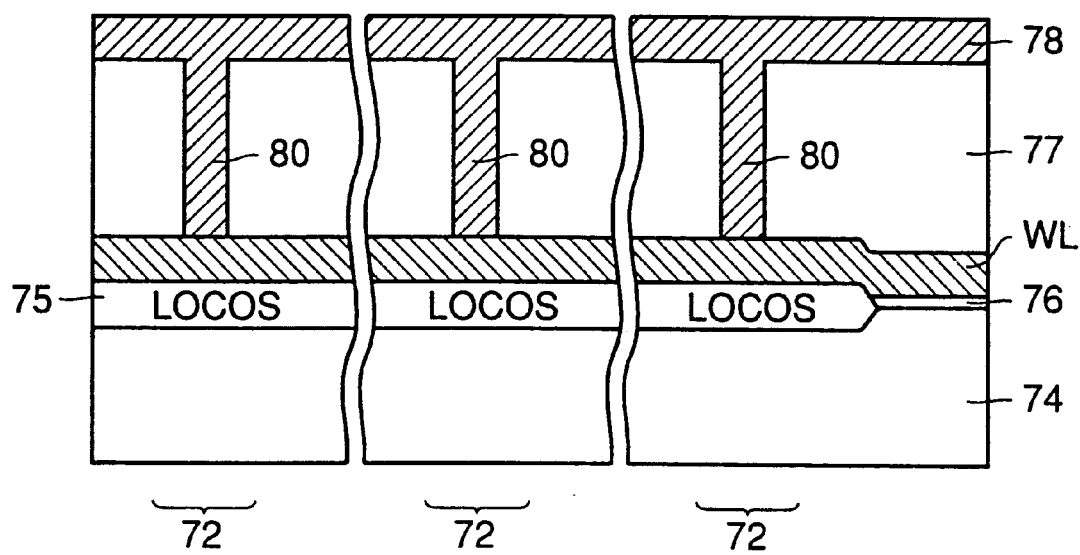
FIG. 15 is a cross section of the structure shown in FIGS. 13 and 14 taken along one word line.

FIG. 15 is a cross section of the structure shown in FIGS. 13 and 14 taken along one word line. Referring to FIG. 15, word line WL is formed on a semiconductor substrate 74 with an oxide film 76 therebetween. A shunt line 78 formed of a first aluminum layer is located above word line WL with an interlayer insulating film 77 therebetween. Shunt line 78 is connected to word line WL via a through-hole 80 formed in interlayer insulating film 77 on word line shunt region 72. Accordingly, a resistance value of word line WL per unit length can be reduced, and a boosted voltage can be transmitted from row decoder 16 to a remote end of word line WL without causing large voltage drop even in this structure including long word line WL.

As can be seen from the embodiment 5 described above, in the structure wherein memory mat 12 is divided by word line shunt regions 72, a large number of global I/O line pairs GIO can be arranged such that they extend on the memory cell arrays between word line shunt regions 72.

Other Embodiments

In the embodiment 1 shown in FIG. 8, long gate electrodes 46 are employed for forming transistors 301–304 having allowed maximum sizes in narrow sense amplifier region 22. Instead of this, the device may employ a structure disclosed, e.g., in FIG. 4 of 1995 VLSI Circuit Symp. Digest papers 13-4 "A 286 mm$^2$ 256 Mb DRAM with X32 Both-Ends DQ" Y. Watanabe et al. According to this structure, sense amplifiers and column select gates are irregularly arranged, and switching elements such as transistors 301–304 are interposed between them.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array divided into a plurality of sub-arrays by a plurality of sense amplifier regions each arranged in a row and a plurality of predetermined regions each arranged in a column, said plurality of sub-arrays being arranged in rows and columns, each of said sub-arrays being divided into a plurality of segments, and said plurality of segments being arranged in columns, respectively,
   each of said sub-arrays including a plurality of word lines arranged along the row and extending across said plurality of segments,
   each of said segments including:
      a plurality of bit line pairs arranged along the column,
      a plurality of sense amplifiers formed on said sense amplifier regions, corresponding to said bit line pairs, respectively, and connected to the corresponding bit line pairs, respectively,
      a plurality of local I/O line pairs arranged in parallel with said word lines, and
      a plurality of column select gates each corresponding to one of said bit line pairs, and connected between the corresponding bit line pair and one of said local I/O line pairs;
   a plurality of column select lines arranged in parallel with said bit line pairs, each of said plurality of column select lines extending longitudinally through said sub-arrays arranged in the column, being corresponding to at least two of said column select gates, and being connected to at least the corresponding two column select gates;
   a plurality of global I/O line pairs formed on said sub-arrays between said plurality of predetermined regions, each extending longitudinally through said sub-arrays arranged in the column, arranged in parallel with said bit line pairs, and crossing said plurality of local I/O line pairs; and
   a plurality of switching elements formed on said sense amplifier regions, and connected between said plurality of local I/O line pairs and said plurality of global I/O line pairs, respectively.

2. The semiconductor memory device according to claim 1, further comprising:
   a first sense amplifier drive line connected to said plurality of sense amplifiers, wherein
   each of said switching elements includes a transistor having a gate connected to said first sense amplifier drive line.

3. The semiconductor memory device according to claim 1, wherein
   each of said switching elements includes N- and P-channel MOS transistors connected in parallel with each other.

4. The semiconductor memory device according to claim 3, further comprising:
   first and second sense amplifier drive lines connected to said plurality of sense amplifiers, wherein
   the gate of the N-channel MOS transistor of said switching element is connected to said first sense amplifier drive line, and the gate of the P-channel MOS transistor of said switching element is connected to said second sense amplifier drive line.

5. The semiconductor memory device according to claim 2, wherein
   the gates of said transistors of said sense amplifiers are arranged to cross at least two of said bit line pairs.

6. The semiconductor memory device according to claim 1, wherein
   one of said paired global I/O lines and the other are arranged alternately with said column select lines.

7. The semiconductor memory device according to claim 1, wherein
   at least two of said column select lines are adjacent to each other, and said global I/O line pairs are arranged on the opposite sides of said column select lines adjacent to each other.

8. The semiconductor memory device according to claim 1, further comprises:
   a row decoder;
   a plurality of main word lines arranged along the row, extending across said plurality of sub-arrays, and connected to said row decoder; and
   a plurality of sub-decoders formed on said predetermined regions, and connected to said plurality of word lines in said sub-arrays, respectively.

9. The semiconductor memory device according to claim 1, wherein
   said plurality of word lines extend through said plurality of sub-arrays arranged in the rows; and
   said semiconductor memory device further comprises:
      a row decoder connected to said plurality of word lines; and
      a plurality of shunt lines corresponding to said plurality of word lines, and each connected to the corresponding word line through a plurality of through-holes formed on said predetermined region.

10. A semiconductor memory device comprising:
    a memory cell array divided into a plurality of sub-arrays by a plurality of sense amplifier regions each arranged in a row and a plurality of predetermined regions each arranged in a column, said plurality of sub-arrays being arranged in rows and columns, each of said sub-arrays being divided into a plurality of segments, and said plurality of segment being arranged in columns, respectively,
    each of said sub-arrays including a plurality of word lines arranged along the row and extending across said plurality of segments,
    each of said segments including a plurality of bit line pairs arranged along the column,
    said semiconductor memory device further comprising:
       a plurality of sense amplifers formed on said sense amplifier regions, corresponding to said bit line pairs, respectively, and connected to the corresponding bit line pairs, respectively,
       a plurality of local data bus line pairs arranged in parallel with said word lines,
       a plurality of column select gates each corresponding to one of said bit line pairs, and connected between the corresponding bit line pair and one of said local data bus line pairs;
       a plurality of column select lines each corresponding to at least two of said column select gates, and connected to at least the corresponding two column select gates; and a plurality of global data bus line pairs formed on said sub-arrays between said plurality of predetermined regions, each extending longitudinally through said sub-arrays arranged in the column, arranged in parallel with said bit line pairs, and crossing said plurality of local data bus line pairs.

11. The semiconductor memory device according to claim 10, wherein said column select lines are arranged in parallel with said bit line pairs, and each of said plurality of column select lines extends longitudinally through said sub-arrays arranged in the column.

12. The semiconductor memory device according to claim 10, further comprising:

a plurality of switching elements formed on said sense amplifier regions, and connected between said plurality of local data bus line pairs and said plurality of global data bus line pairs, respectively.

* * * * *